(12) United States Patent
Kang et al.

(10) Patent No.: US 8,158,034 B2
(45) Date of Patent: Apr. 17, 2012

(54) TIO$_{2-x}$N$_x$ NANOTUBES AND METHOD FOR PREPARING THE SAME

(75) Inventors: Jeung-Ku Kang, Daejeon (KR); Kyu-Sung Han, Seoul (KR); Jung-Woo Lee, Seoul (KR); Yong-Mook Kang, Seoul (KR)

(73) Assignee: Korea Advanced Institute of Science and Technology (KR)

( * ) Notice: Subject to any disclaimer, the term of this patent is extended or adjusted under 35 U.S.C. 154(b) by 124 days.

(21) Appl. No.: 12/488,071

(22) Filed: Jun. 19, 2009

(65) Prior Publication Data

US 2010/0044630 A1    Feb. 25, 2010

(30) Foreign Application Priority Data

Aug. 20, 2008    (KR) .................. 10-2008-0081384

(51) Int. Cl.
*H01B 1/08* (2006.01)
*B05D 5/12* (2006.01)
(52) U.S. Cl. .................. 252/520.22; 423/608; 427/523
(58) Field of Classification Search ............ 252/520.22; 423/608; 977/734; 427/523
See application file for complete search history.

(56) References Cited

U.S. PATENT DOCUMENTS

| 7,011,737 B2* | 3/2006 | Varghese et al. ............... 205/189 |
| 7,521,394 B2* | 4/2009 | Xie et al. ....................... 502/350 |
| 2009/0117384 A1* | 5/2009 | Han ............................... 428/402 |
| 2009/0183994 A1* | 7/2009 | Misra et al. .................... 205/340 |
| 2010/0213046 A1* | 8/2010 | Grimes et al. ............ 204/157.47 |
| 2010/0320089 A1* | 12/2010 | Misra et al. .................... 205/109 |

OTHER PUBLICATIONS

Burda et al "Enhanced Nitrogen Doping in TiO2 Nanoparticles", Nano Letters 2003, vol. 3, No. 8, 1049-51 (2003).*
Ghicov, A. et al., "Ion Implantation and Annealing for an Efficient N-Doping of TiO2 Nanotubes," Nano Letters, American Chemical Society, vol. 6, No. 5 1080-1082, Apr. 27, 2006.
Vitiello, R. et al., "N-Doping of anodic TiO2 nanotubes using heat treatment in ammonia," Electrochemistry Communications 8 (2006) 544-548.

* cited by examiner

*Primary Examiner* — Mark Kopec
(74) *Attorney, Agent, or Firm* — Baker & Hostetler LLP

(57) ABSTRACT

TiO$_{2-x}$N$_x$ (0.01≦x≦0.2) nanotubes and a method for preparing the same are disclosed. More particularly, TiO$_{2-x}$N$_x$ (0.01≦x≦0.2) nanotubes doped with nitrogen atoms by treating TiO$_2$ nanotubes through nitrogen plasma to partially substitute oxygen portion of TiO$_2$ nanotube with nitrogen, and a method for preparing the same are disclosed. The TiO$_{2-x}$N$_x$ (0.01≦x≦0.2) nanotube of the present invention is prepared by doping nitrogen on a TiO$_2$ nanotube to control an electronic structure and reduce a band gap of the TiO$_2$ nanotube, so that the prepared TiO$_{2-x}$N$_x$ (0.01≦x≦0.2) nanotube exhibits improved conductivity and extended light absorption range from a UV ray area up to a visible light area, thus having more enhanced applicable performance in optical and/or electrochemical aspects.

4 Claims, 5 Drawing Sheets

$TiO_{2-x}N_x$ NANOTUBES AND METHOD FOR PREPARING THE SAME

CROSS-REFERENCE TO RELATED APPLICATIONS

This application claims priority to foreign Patent Application KR 10-2008-0081384, filed on Aug. 20, 2008, the disclosure of which is incorporated herein by reference in its entirety.

FIELD OF THE INVENTION

The present invention relates to $TiO_{2-x}N_x$ ($0.01 \leq x \leq 0.2$) nanotubes and a method for preparing the same and, more particularly, to $TiO_{2-x}N_x$ ($0.01 \leq x \leq 0.2$) nanotubes doped with nitrogen atoms by treating $TiO_2$ nanotubes through nitrogen plasma to partially substitute oxygen portion of $TiO_2$ nanotube with nitrogen, and a method for preparing the same.

BACKGROUND OF THE INVENTION

A nanosized material shows different electrical, optical and/or magnetic properties, as compared to bulk materials and, therefore, has recently attracted attention in a wide range of applications. Especially, a substance in a nanotube structure having nanosized holes has relatively high specific surface area and a number of researches have been conducted for structures of various substances. In addition, since the nanotube structure can be multiply used in a variety of applications with respect to modern sciences and technologies, a great deal of studies and investigations into the same are currently conducted over the world.

As such, a nanosized material, in particular, an atomic structure and/or constitutional composition thereof closely associates with a structure and/or characteristics of a resultant nanosized substance. Therefore, in order to obtain a final nanosized product having desired structure and characteristics, an investigation into control of such atomic structure and/or natural features of a raw nanosized material must be preceded.

However, it is difficult to fabricate nanosized substances having desired structure and/or characteristics by controlling the structure in atomic scale and development of such techniques is now slightly progressed. As for a $TiO_2$ bulk material, an anatase phase is mostly studied for its application to a light absorbing material, and an anode of a lithium secondary cell, etc., and is known to have a wide band gap energy of 3.2 eV capable of absorbing UV ray ranges only. In order to improve light absorption efficiency of the anatase phase of the $TiO_2$ bulk material, efforts for control of the band gap energy by improving an electronic structure thereof have been continued. As an method for improving the electronic structure, a process for doping different elements on an anatase phase of the $TiO_2$ bulk material was proposed as the most preferable and simple technique. Especially, it has been reported that doping of nitrogen among such different elements may considerably reduce a band gap energy sufficiently to extend a light absorption layer of $TiO_2$ up to a visible light area. Nitrogen doping into $TiO_2$ may induce adsorption of nitrogen in molecular state, penetration of nitrogen into a $TiO_2$ matrix, or substitution of oxygen with nitrogen. It was also reported that the nitrogen doping in the form of oxygen substitution with nitrogen is most effective to control an electronic structure of $TiO_2$. Method for doping nitrogen may include, for example: a method for doping nitrogen by adding nitrogen to gas or a solution during formation of a thin film or a nanosized structure of $TiO_2$; and, as a post processing, a method for directly penetrating nitrogen ions into $TiO_2$ by thermal treatment or ion implantation under nitrogen atmosphere, and so forth. However, these techniques generally have a drawback such that nitrogen is not doped in atomic state, instead of being adsorbed in molecular state. In addition, nitrogen ions directly injected and penetrated into a $TiO_2$ matrix often cause a damage to an original structure of $TiO_2$, thus entailing difficulty in maintaining an initial anatase phase of the $TiO_2$.

Since a $TiO_2$ nanotube typically has a higher specific surface area and excellent vertical orientation than $TiO_2$ bulk material, relatively large reaction area and/or high electron mobility may be expected. Accordingly, if substitution of atomic nitrogen is done on the $TiO_2$ nanotube, an electronic structure and a band gap of the nanotube are controlled so that enhanced performance of the $TiO_2$ nanotube may result more than light or electrochemical application of the nanotube is performed.

Examples of conventional technologies relating to the present invention may include technical concepts disclosed by A. Ghicov (A. Ghicov, J. Macak et al., NanoLett. 2006. 6. 1080) and R. P. Vitiello (R. P. Vitiello, J. M. Macak et al., Electrochem. Commun. 2006. 8. 544), however, these techniques encountered problems in that nitrogen is not doped in atomic state, instead of being adsorbed in molecular state, and nitrogen ion irradiation causes significant breaking of the original $TiO_2$ structure.

SUMMARY OF THE INVENTION

Embodiments of the present invention advantageously provide a $TiO_{2-x}N_x$ ($0.01 \leq x \leq 0.2$) nanotube by nitrogen doping in a mode of substituting oxygen portion of $TiO_2$ nanotube with nitrogen atoms, in order to control an electronic structure of the $TiO_2$ nanotube, and a method for preparing the same.

The present invention also provides a $TiO_{2-x}N_x$ ($0.01 \leq x \leq 0.2$) nanotube doped with nitrogen in a mode of substituting oxygen portion of $TiO_2$ nanotube with nitrogen atoms.

The present invention also provides a method for preparing a $TiO_{2-x}N_x$ ($0.01 \leq x \leq 0.2$) nanotube by treating a $TiO_2$ nanotube through nitrogen plasma to obtain the $TiO_2$ nanotube doped with nitrogen.

The $TiO_{2-x}N_x$ ($0.01 \leq x \leq 0.2$) nanotube prepared by the present invention has a controlled electronic structure and a reduced band gap by nitrogen doping on an existing $TiO_2$ nanotube. As a result, the $TiO_{2-x}N_x$ ($0.01 \leq x \leq 0.2$) nanotube exhibits improved conductivity and extended light absorption range from a UV ray area to a visible light area, thus having enhanced applicable performance in optical and/or electrochemical aspects.

BRIEF DESCRIPTION OF THE DRAWINGS

These and other features, aspects, and advantages of the present invention will be more fully described in the following detailed description of preferred embodiments and examples, taken in conjunction with the accompanying drawings. In the drawings:

FIGS. 1A and 1B are scanning electron microscopic (SEM) images of a $TiO_2$ nanotube prepared by an anodizing process, respectively: wherein FIG. 1A is a SEM image illustrating a top portion of the $TiO_2$ nanotube; and FIG. 1B is a SEM image illustrating a bottom portion of the same;

DETAILED DESCRIPTION

Figure 1A:
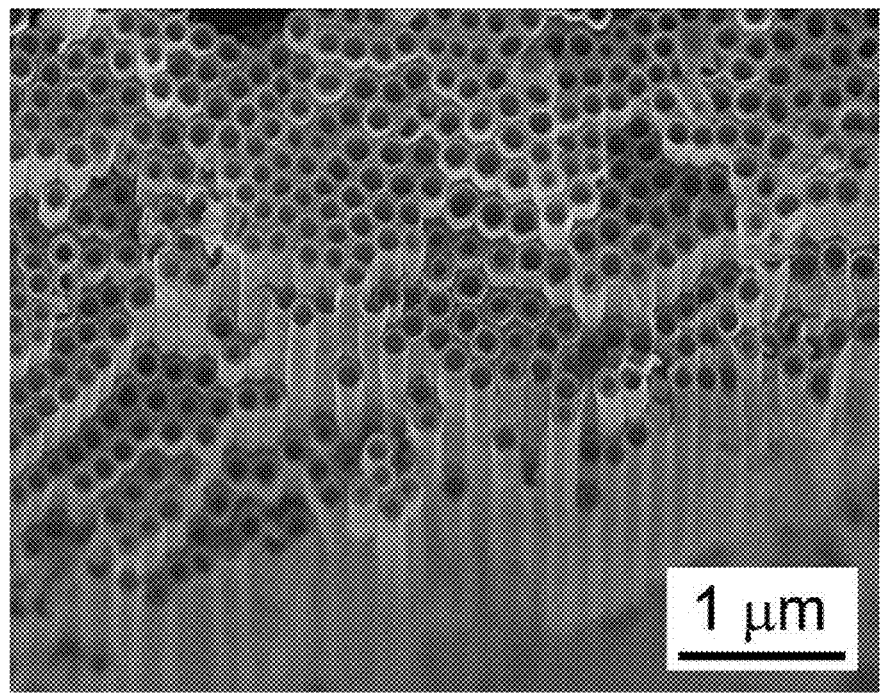

The invention will now be described with reference to the drawing figures, in which like reference numerals refer to like parts throughout.

The present invention provides a $TiO_{2-x}N_x$ ($0.01 \leq x \leq 0.2$) nanotube doped with nitrogen atoms by treating a $TiO_2$ nanotube through nitrogen plasma so as to control an electronic structure of the $TiO_2$ nanotube, thus having enhanced performance in optical and/or electrochemical aspects and, in addition, a method for preparing the same.

Electrical properties of the $TiO_2$ nanotube closely depend upon an atomic structure of the nanotube or kinds and/or shapes of foreign materials added thereto. Therefore, in order to fulfill desired electrical properties, a structure of added atoms must be controlled. Rather than adsorption of nitrogen in molecular state, doping of nitrogen in atomic state may properly control the electrical properties so as to reduce a band gap of $TiO_2$. More particularly, nitrogen doping in a mode of substituting oxygen portion of $TiO_2$ with nitrogen may more efficiently control electrical properties to reduce a band gap of $TiO_2$ rather than penetration of nitrogen into a $TiO_2$ matrix. As a result, the prepared nanotube may exhibit enhanced conductivity and the electronic structure of $TiO_2$ normally absorbing light in a UV ray range may be improved to extend the light absorption range up to a visible light area, thus enhancing the light absorption efficiency.

The present invention provides a $TiO_{2-x}N_x$ ($0.01 \leq x \leq 0.2$) nanotube having oxygen portion of a $TiO_2$ nanotube substituted with nitrogen by the nitrogen plasma treatment described above.

According to the present invention, in order to reinforce doping effects through nitrogen plasma treatment, nitrogen gas may be added in the range of 10 to 100% by volume relative to a reactive gas during plasma generation while regulating a flow rate in the range of 10 to 200 sccm (standard cubic centimeter per minute).

Such nitrogen plasma treatment may be performed at a plasma power ranging from 400 to 800 W, preferably 500 to 600 W and at a temperature of 50 to 400° C., preferably 50 to 200° C.

In addition, the nitrogen plasma treatment according to the present invention requires limited treatment time and may be performed for 1 to 20 minutes, preferably about 5 minutes. If the treatment time is beyond the above range of time, plasma etching is excessively performed, causing a problem of not maintaining the structure of the $TiO_2$ nanotube.

As disclosed above, nitrogen doping through nitrogen plasma may dope nitrogen on $TiO_2$ in a mode of oxygen substation with nitrogen, while not significantly damage a phase and an original structure of $TiO_2$.

Hereinafter, preferred embodiments of the present invention will be described in detail in the following example and experimental example which are given for illustrative purposes only and should not be construed as limiting the spirit and scope of the present invention.

EXAMPLE (1) Preparation of $TiO_2$ Nanotube.

To prepare a $TiO_2$ nanotube, a titanium (Ti) foil was treated in a mixture solution by anodizing via a certain DC power supply.

A DC voltage used herein was 60V and the mixture solution was prepared by adding 0.25 wt. % ammonium fluoride to an ethyleneglycol solvent. Platinum (Pt) or nickel (Ni) was used as a counter electrode and the Ti foil was treated by anodizing for 5 hours to form an amorphous $TiO_2$ nanotube. Such amorphous $TiO_2$ nanotube was heat treated at 400° C. for 3 hours under air or oxygen atmosphere to convert the amorphous $TiO_2$ nanotube into anatase phase, thus obtaining a crystalline $TiO_2$ nanotube.

(2) Nitrogen Plasma Treatment.

The crystalline $TiO_2$ nanotube in the anatase phase prepared in Example (1) was subjected to nitrogen doping as follows: nitrogen plasma treatment was performed at a flow rate of 100 sccm, a plasma power of 500 W and a temperature of 200° C. for 5 minutes. As a result, a $TiO_{2-x}N_x$ nanotube was prepared.

(3) Evaluation of Optical and/or Electrochemical Characteristics Using $TiO_{2-x}N_x$ Nanotube.

Using the $TiO_{2-x}N_x$ nanotube prepared in Example (2) as an anode material, a lithium ion based secondary cell was fabricated and electrochemical properties thereof were evaluated. A coin typed cell CR2016 was used under argon atmosphere, the $TiO_2$ nanotube and the $TiO_{2-x}N_x$ nanotube were used as anodes while applying a lithium metal foil as a counter electrode. 1M lithium perchlorate ($LiClO_4$) was added to a mixture of ethylene carbonate (EC) and dimethyl carbonate (DMC) in a ratio by volume of 1:1 in order to prepare an electrolyte. Charge and discharge characteristics were determined at a voltage of 1 to 3V (vs Li/Li+) over 50 cycles. Likewise, at the same voltage defined above, open circuit voltage (OCV) and closed circuit voltage (CCV) were also determined.

In addition, in order to analyze variation in light absorption characteristics of each of the $TiO_2$ nanotube and the $TiO_{2-x}N_x$ nanotube, UV-visible spectra were observed.

EXPERIMENTAL EXAMPLE (1) Analysis of Structures and Elements of $TiO_2$ Nanotube and $TiO_{2-x}N_x$ Nanotube.

Structures of the $TiO_2$ nanotube and the $TiO_{2-x}N_x$ nanotube prepared in the present invention and elements contained therein were analyzed in this experimental example. SEM, XRD or XPS (X-ray photoelectron spectroscopy) analysis was adopted to illustrate structures of the $TiO_2$ nanotube and the $TiO_{2-x}N_x$ nanotube prepared in the Example (1) and (2) and elements contained therein, and atomic structures of the nanotubes as shown in FIGS. 1A to 1D.

Figure 1B:
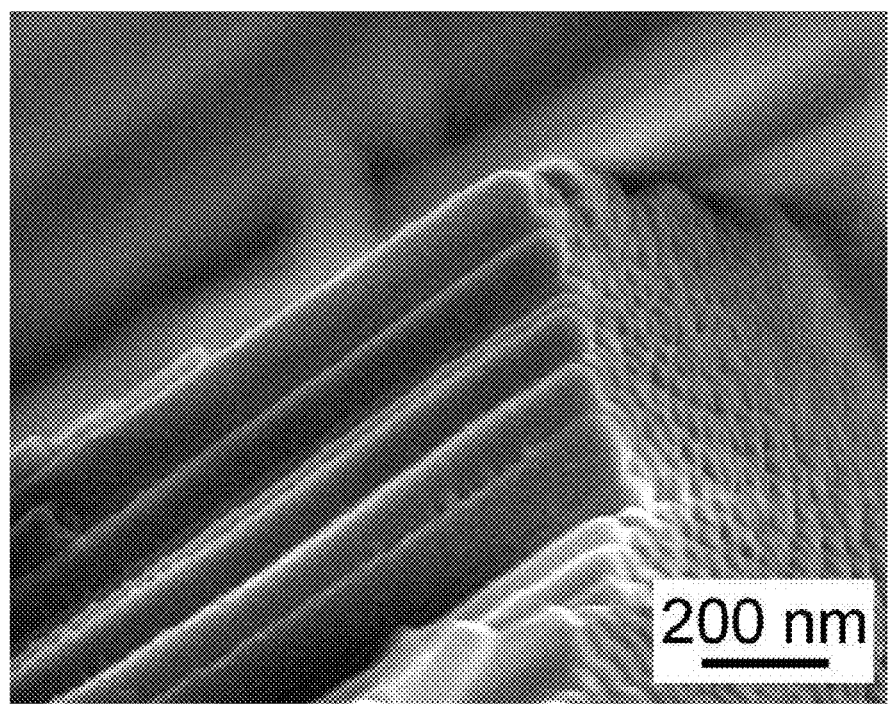

FIGS. 1A and 1B show SEM images of a $TiO_2$ nanotube prepared by an anodizing process, respectively. FIG. 1A is a SEM image illustrating a top portion of the $TiO_2$ nanotube while FIG. 1B is a SEM image illustrating a bottom portion of the same. Each nanotube has a diameter of about 100 nm and a length of about 5 μm. The top portion is open while the bottom portion is closed.

Figure 1C:
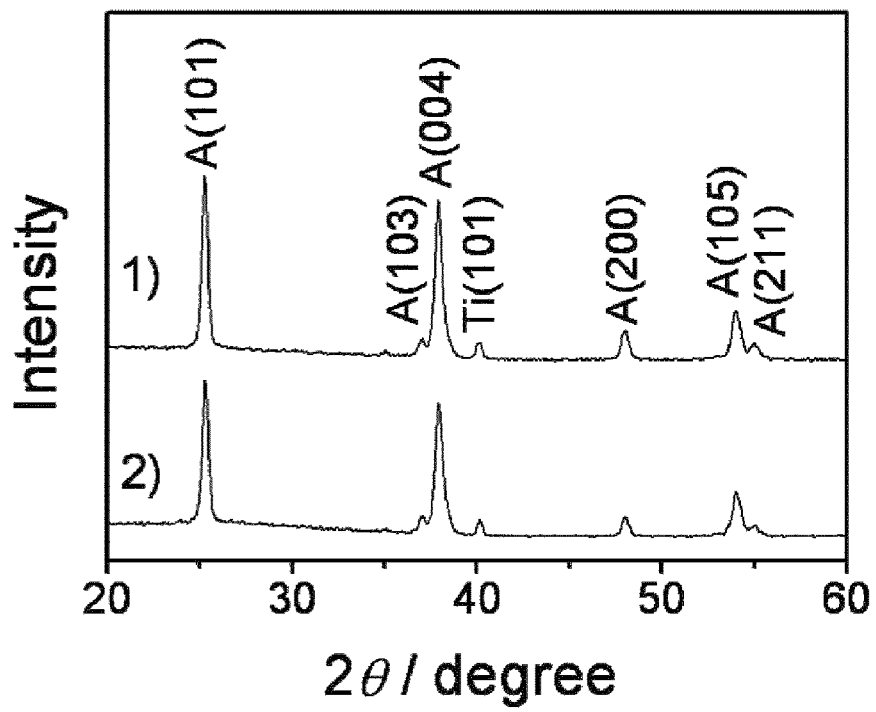
FIG. 1C shows X-ray diffraction (XRD) analysis results of 1) a $TiO_2$ nanotube, and 2) a $TiO_{2-x}N_x$ nanotube.

FIG. 1C shows XRD analysis results of 1) a $TiO_2$ nanotube, and 2) a $TiO_{2-x}N_x$ nanotube. From the XRD analysis results, it can be seen that the $TiO_2$ nanotube has an anatase phase. Since a height of the graph was a little reduced after nitrogen plasma treatment of the $TiO_2$ nanotube but a position of the graph was not significantly altered, it is understood that the original structure of $TiO_2$ was maintained without significant damage.

Figure 1D:
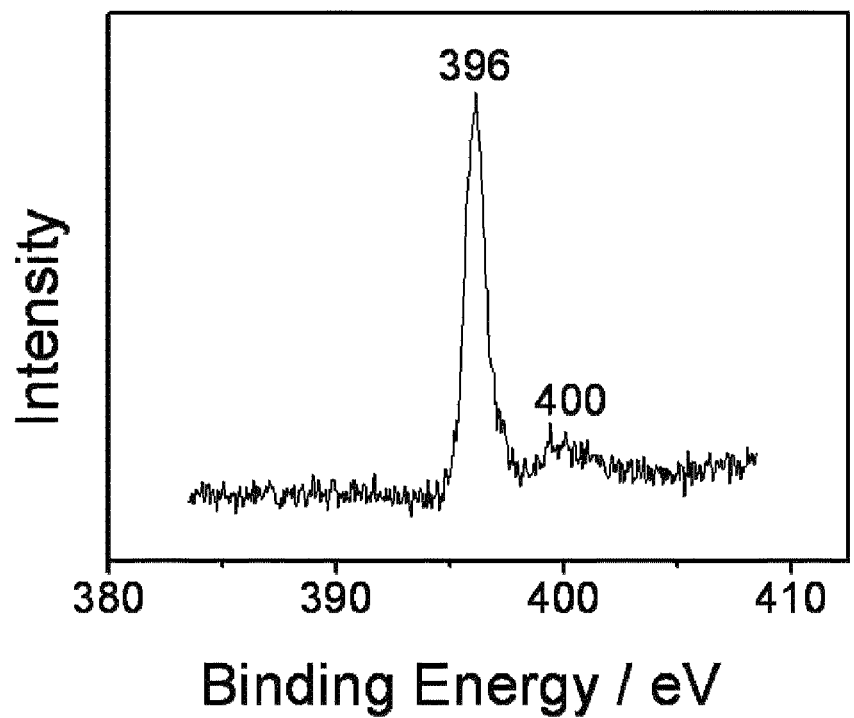
FIG. 1D shows X-ray photoelectron spectroscopy (XPS) analysis results of a $TiO_{2-x}N_x$ nanotube.

FIG. 1D shows XPS analysis results of a $TiO_{2-x}N_x$ nanotube, which illustrate an atomic structure and a bonding form of nitrogen to the $TiO_{2-x}N_x$ nanotube treated by nitrogen plasma. From XPS analysis results of the $TiO_{2-x}N_x$ nanotube, it was found that a content of nitrogen is about 6.4 at. % and 'x' is about 0.1, leading to a composition of $TiO_{1.9}N_{0.1}$.

The $TiO_{2-x}N_x$ nanotube is doped with a small amount of nitrogen and has atomic bonding units of $TiO_2$ wherein the nitrogen content 'x' is a little varied dependent upon reaction conditions. As for bonding form of the $TiO_{2-x}N_x$ nanotube to nitrogen, the graph in FIG. 1D shows two peaks at 396 eV and 400 eV. The peak at 396 eV illustrates nitrogen atom in $TiO_2$ as placed in atomic state and means that the $TiO_{2-x}N_x$ nanotube structure was formed. On the other hand, the peak at 400 eV illustrates chemical adsorption of nitrogen in molecular state. From XPS analysis results, it was found that the peak at 396 eV is considerably stronger than the peak at 400 eV. That is, nitrogen plasma treatment in the present invention inhibited nitrogen doping in molecular state and was effective to form the $TiO_{2-x}N_x$ nanotube by nitrogen doping in a mode of oxygen substitution with nitrogen atoms.

(2) Analysis of Optical and/or Electrochemical Characteristics of $TiO_{2-x}N_x$ Nanotube.

For analysis of optical and/or electrochemical characteristics of the $TiO_{2-x}N_x$ nanotube, UV-visible spectra were observed. Also, a lithium secondary cell fabricated using the $TiO_2$ nanotube and the $TiO_{2-x}N_x$ nanotube as an anode was subjected to measurement of OCV and CCV as well as evaluation of charge and discharge characteristics.

Figure 2:
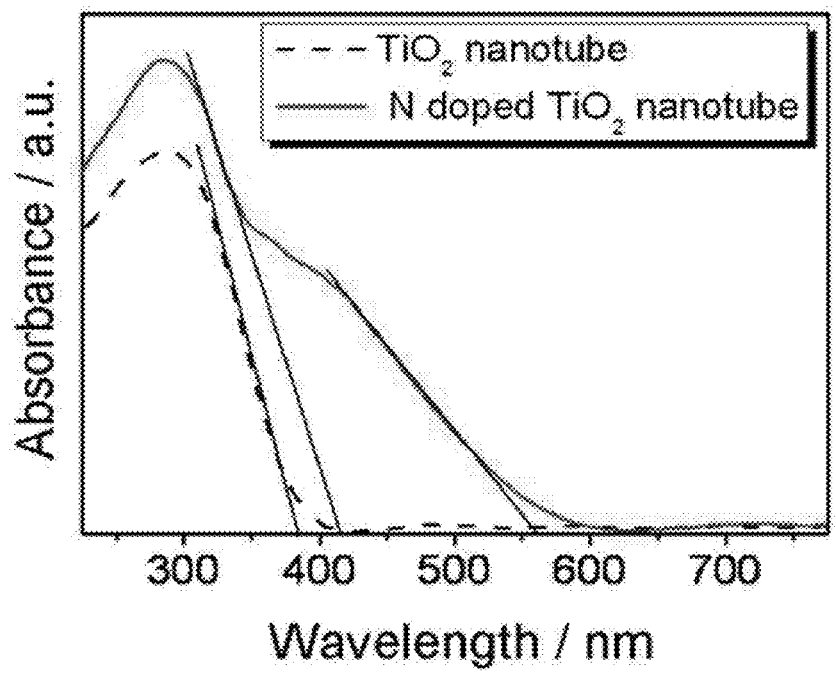
FIG. 2 shows UV-visible spectral analysis results of a $TiO_2$ nanotube and a N-doped $TiO_2$ nanotube($TiO_{2-x}N_x$ nanotube)

FIG. 2 shows UV-visible spectral analysis results of a $TiO_2$ nanotube and a $TiO_{2-x}N_x$ nanotube. For the $TiO_2$ nanotube, an initial absorption wavelength was 384 nm which corresponds to a band gap at 3.2 eV and is identical to a band gap of $TiO_2$ in the anatase phase. For the $TiO_{2-x}N_x$ nanotube, two absorption peaks starting at 556 nm and 416 nm were observed, which correspond to band gaps at 2.2 eV and 3.0 eV, respectively. Accordingly, the $TiO_{2-x}N_x$ nanotube absorbed light at a wider wavelength range extending to the visible light area than the $TiO_2$ nanotube and exhibited more enhanced light absorption efficiency.

FIG. 3 shows evaluation of electrochemical characteristics. More particularly, FIG. 3A illustrates OCV-CCV analysis results for a first lithium absorption of the $TiO_2$ nanotube and a graph at the upper right side thereof shows a polarization profile obtained from OCV-CCV. FIG. 3B illustrates OCV-CCV analysis results for a first lithium absorption of the $TiO_{2-x}N_x$ nanotube and a graph at the upper right side shows a polarization profile obtained from OCV-CCV. From the electrochemical analysis results, it can be seen that nitrogen doping does not have significant influence on a charge and discharge mechanism. In addition, the $TiO_2$ nanotube has a resistance considerably greater than the $TiO_{2-x}N_x$ nanotube in an initial stage to absorb lithium ions. Results shown in FIGS. 3C and 3D relate to electron charge transfer, and they demonstrate that doped nitrogen serves as an acceptor which accepts electrons to improve conductivity, thus enhancing cyclic characteristics.

Figure 3A:
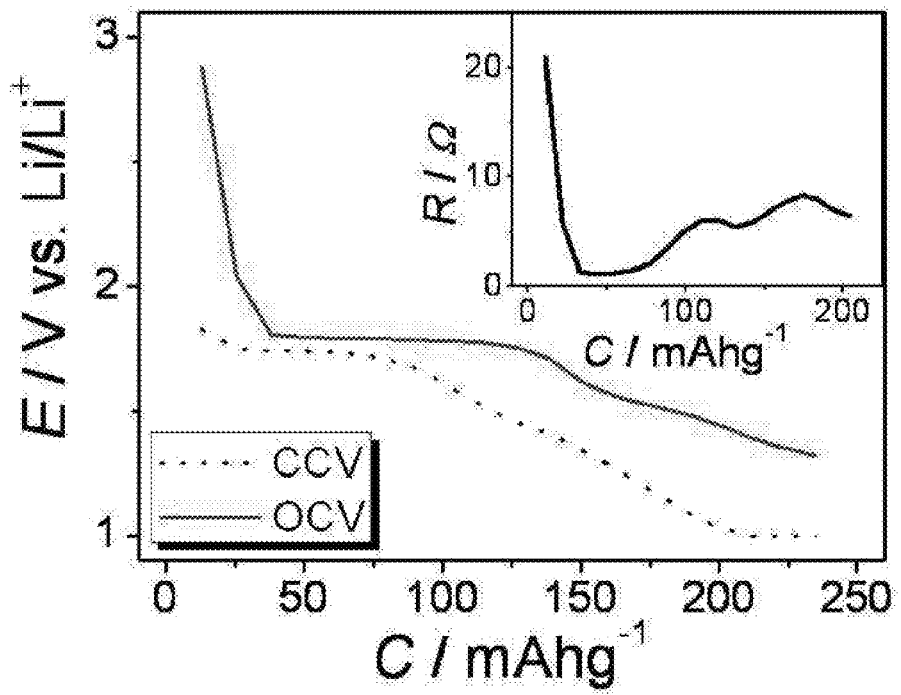
FIG. 3A shows OCV-CCV analysis results for a first lithium absorption of the $TiO_2$ nanotube and, in addition, a graph at the upper right side showing a polarization profile obtained from OCV-CCV.
Figure 3B:
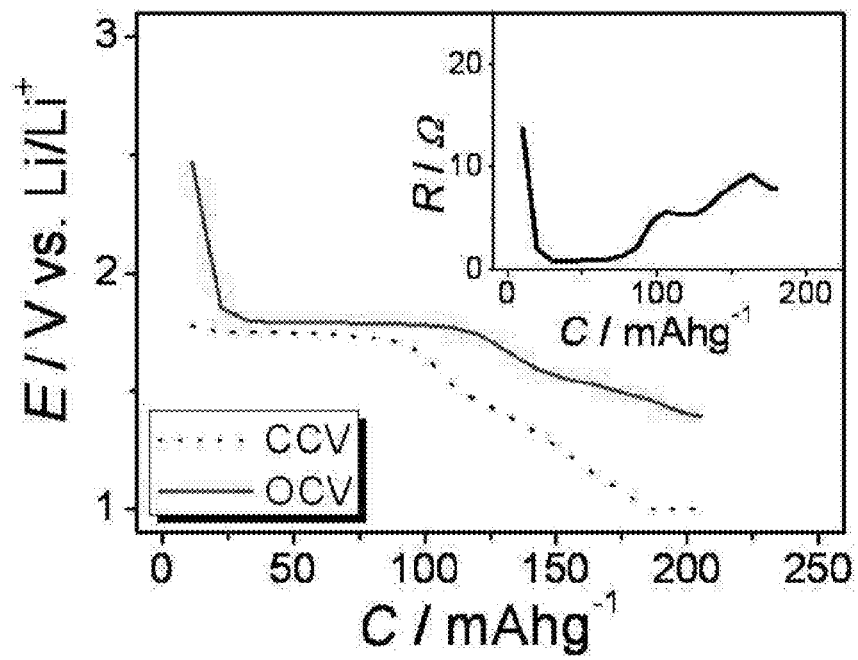
FIG. 3B shows OCV-CCV analysis results for a first lithium absorption of the $TiO_{2-x}N_x$ nanotube and, in addition, a graph at the upper right side showing a polarization profile obtained from OCV-CCV.
Figure 3C:
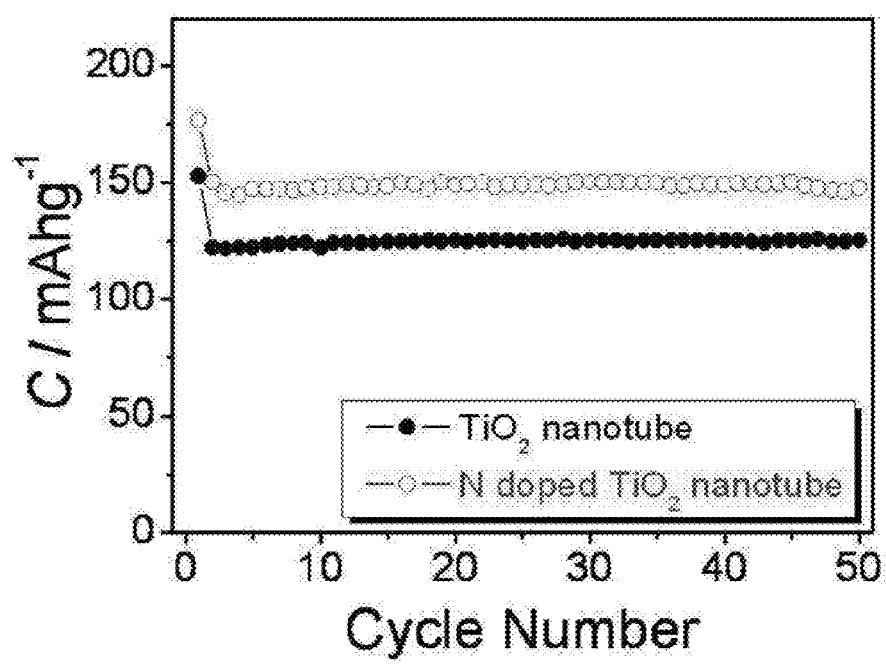
FIG. 3C illustrates cyclic characteristics of $TiO_2$ nanotube and N-doped $TiO_2$ nanotube($TiO_{2-x}N_x$ nanotube)
Figure 3D:
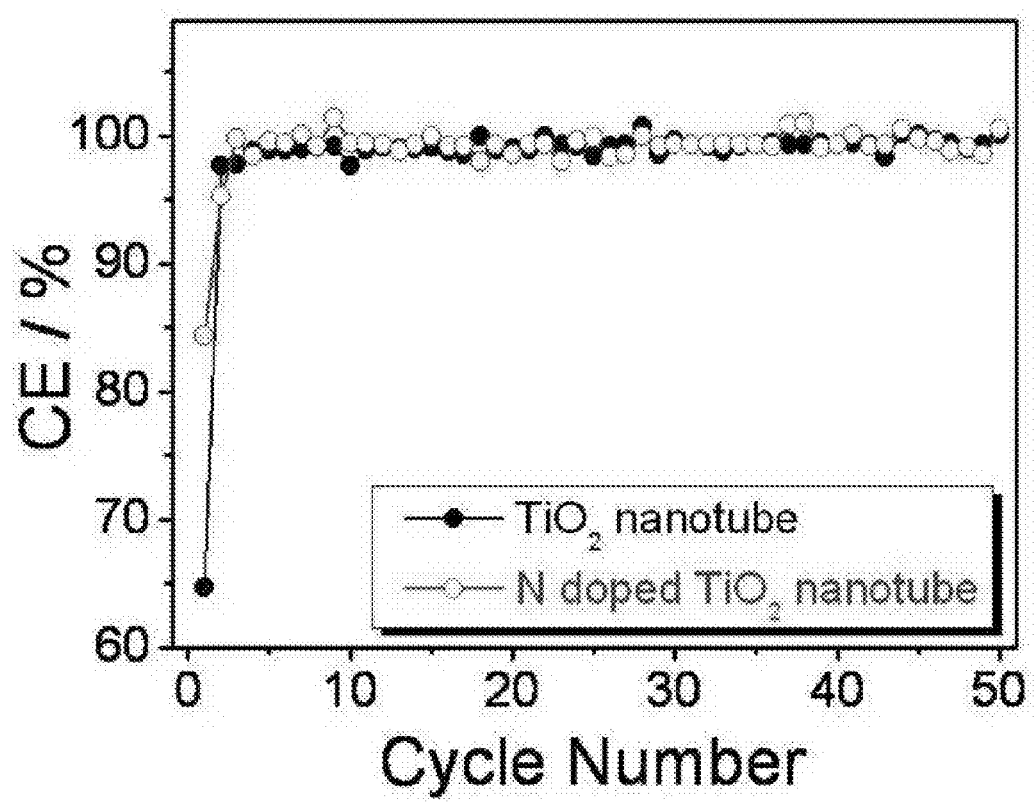
FIG. 3D shows analysis results of coulombic efficiencies of $TiO_2$ nanotube and N-doped $TiO_2$ nanotube($TiO_{2-x}N_x$ nanotube).

Specifically, FIG. 3C shows cyclic characteristics of the $TiO_2$ nanotube and the $TiO_{2-x}N_x$ nanotube. And FIG. 3D shows analysis results of coulombic efficiencies of the $TiO_2$ nanotube and the $TiO_{2-x}N_x$ nanotube. The cyclic characteristics of the $TiO_2$ nanotube and the $TiO_{2-x}N_x$ nanotube were both remarkably stable and the $TiO_{2-x}N_x$ nanotube exhibited more excellent absorption of lithium ions than the $TiO_2$ nanotube. The coulombic efficiencies of the $TiO_2$ nanotube and the $TiO_{2-x}N_x$ nanotube were about 65% and 84%, respectively, demonstrating that the electron charge transfer has significant influence on the electrochemical performance of the nanotube.

As is apparent from the above description, preparation of a $TiO_{2-x}N_x$ nanotube using nitrogen plasma treatment may be achieved by nitrogen substitution in atomic scale while maintaining an original structure of $TiO_2$. Controlling an electronic structure of the $TiO_2$ nanotube to reduce a band gap thereof may enhance optically and/or electrochemically applicable performance, and therefore, the $TiO_{2-x}N_x$ nanotube of the present invention may be favorably applied to manufacture of an electrode of a solar cell and/or a lithium secondary cell.

While the present invention has been described with reference to the preferred embodiments, it will be understood by those skilled in the art that various modifications and variations may be made therein without departing from the scope of the present invention as defined by the appended claims.

What is claimed is:

1. A $TiO_{2-x}N_x$ ($0.01 \leq x \leq 0.2$) nanotube doped with nitrogen by doping a $TiO_2$ nanotube through nitrogen plasma treatment in order to improve optical and/or electrochemical performance thereof,
    wherein the nitrogen plasma treatment substitutes oxygen of the $TiO_2$ nanotube with nitrogen so that nitrogen is present in atomic state in a $TiO_2$ matrix to form a $TiO_{2-x}N_x$ structure.

2. A method for preparing a $TiO_{2-x}N_x$ ($0.01 \leq x \leq 0.2$) nanotube of claim 1 comprising doping of a $TiO_2$ nanotube through nitrogen plasma treatment.

3. The method according to claim 2, wherein the doping through nitrogen plasma treatment is performed at a flow rate ranging from 10 to 200 standard cubic centimeter per minute.

4. The method according to claim 2, wherein the doping through nitrogen plasma treatment is performed at a plasma power ranging from 400 to 800 W and at a temperature of 50 to 400° C.

* * * * *